(12) United States Patent
Yanai et al.

(10) Patent No.: US 8,986,450 B1
(45) Date of Patent: Mar. 24, 2015

(54) SUBSTRATE PROCESSING APPARATUS AND METHOD OF MANUFACTURING SEMICONDUCTOR DEVICE

(71) Applicant: Hitachi Kokusai Electric Inc., Tokyo (JP)

(72) Inventors: Hidehiro Yanai, Toyama (JP); Hiroshi Ashihara, Toyama (JP); Atsushi Sano, Toyama (JP); Tadashi Takasaki, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/229,151

(22) Filed: Mar. 28, 2014

(30) Foreign Application Priority Data

Jan. 30, 2014 (JP) .................... 2014-015523

(51) Int. Cl.
| | | |
|---|---|---|
| H01L 21/67 | (2006.01) | |
| H01L 21/00 | (2006.01) | |
| C23C 16/455 | (2006.01) | |
| C23C 16/52 | (2006.01) | |
| H01L 21/02 | (2006.01) | |

(52) U.S. Cl.
CPC .... H01L 21/67017 (2013.01); H01L 21/02104 (2013.01); C23C 16/45587 (2013.01); C23C 16/45519 (2013.01); C23C 16/45591 (2013.01); C23C 16/52 (2013.01); C23C 16/45561 (2013.01); C23C 16/45523 (2013.01)
USPC ................. 118/715; 156/345.33; 156/345.34; 438/689; 438/758

(58) Field of Classification Search
CPC .................. H01L 21/67017; H01L 21/02104; C23C 16/45519; C23C 16/45523; C23C 16/45561; C23C 16/45587; C23C 16/45591; C23C 16/52

USPC ......... 118/715; 156/345.33, 345.34; 438/689, 438/758

See application file for complete search history.

(56) References Cited

U.S. PATENT DOCUMENTS

| | | | | |
|---|---|---|---|---|
| 8,715,455 | B2 * | 5/2014 | Brcka ..................... | 156/345.34 |
| 2005/0229848 | A1 * | 10/2005 | Shinriki et al. ............... | 118/715 |
| 2006/0213439 | A1 * | 9/2006 | Ishizaka ....................... | 118/715 |
| 2008/0202416 | A1 * | 8/2008 | Provencher et al. .......... | 118/715 |
| 2008/0314522 | A1 * | 12/2008 | Bera et al. ................ | 156/345.33 |
| 2009/0087339 | A1 * | 4/2009 | Shinriki ...................... | 420/462 |
| 2012/0255678 | A1 * | 10/2012 | Holland et al. .......... | 156/345.33 |
| 2013/0199729 | A1 * | 8/2013 | Ishida ...................... | 156/345.34 |

FOREIGN PATENT DOCUMENTS

JP 2009-235470 A 10/2009

* cited by examiner

*Primary Examiner* — Jeffrie R Lund
(74) *Attorney, Agent, or Firm* — Volpe and Koenig, P.C.

(57) ABSTRACT

Generation of adhered materials in a space over a gas guide of a shower head is inhibited. A substrate processing apparatus includes a process chamber; a buffer chamber including a dispersion unit; a process gas supply hole installed in a ceiling portion of the buffer chamber; an inert gas supply hole installed in the ceiling portion; a gas guide disposed in a gap between the dispersion unit and the ceiling portion, the gas guide including a base end portion disposed at a side of the process gas supply hole, a leading end portion disposed closer to the inert gas supply hole than to the process gas supply hole, and a plate portion connecting the base end portion and the leading end portion; a process chamber exhaust unit; and a control unit.

15 Claims, 6 Drawing Sheets

SUBSTRATE PROCESSING APPARATUS AND METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application No. 2014-015523, filed on Jan. 30, 2014, in the Japanese Patent Office, the entire contents of which are hereby incorporated by reference.

BACKGROUND OF THE INVENTION

1. Field of the Invention

The present invention relates to a substrate processing apparatus and a method of manufacturing a semiconductor device.

2. Description of the Related Art

In recent years, semiconductor devices such as flash memories have become highly integrated. Thus, a pattern size is being markedly downscaled. When patterns are formed, a predetermined processing process, such as an oxidation process, a nitridation process, etc., may be performed on a substrate as one process of a manufacturing process.

As a method of forming the patterns, a groove is formed between circuits, and a seed film, a liner film, or a line is formed. With recent miniaturization, the groove is formed to obtain a high aspect ratio.

To form the liner film, it is necessary to form a film having good step coverage, which has no variation in film thickness even in an upper side surface, a middle side surface, a lower side surface, and a lower portion of the groove. Due to the film having the good step coverage, a semiconductor device may have uniform characteristics between grooves, and a variation in the characteristics of the semiconductor device may be inhibited.

A process of processing the groove having a high aspect ratio by heating a gas or using a plasma-state gas has been attempted. However, it was difficult to form a film having good step coverage.

As a method of forming the film, there is an alternate supply method of alternately supplying at least two process gases to cause a reaction on the surface of a substrate.

Meanwhile, since it is necessary to uniformize the characteristics of the semiconductor device, gases need to be uniformly supplied to a surface of the substrate during formation of a thin film. Thus, a single-wafer-type apparatus capable of uniformly supplying gases to a processed surface of the substrate has been developed. In the single-wafer-type apparatus, for example, a shower head including a buffer space is installed on a substrate to supply gases more uniformly.

In the alternate supply method, a process of purging a remnant gas using a purge gas during the supply of each gas is known to inhibit a reaction of respective gases on the surface of the substrate. However, a film forming time is retarded due to addition of the purge process. Accordingly, to reduce a process time, the remnant gas is exhausted by supplying a large amount of purge gas.

In addition, a type of shower head in which a path or buffer space for each gas is installed to prevent mixture of respective gases may be considered. However, since such a structure is complicated, maintenance becomes burdensome, and costs increase. For this reason, it is practical to use the shower head in which supply systems of two gases and a purge gas are provided in a single buffer space.

When the shower head including the buffer space common to two kinds of gases is used, it may be inferred that remnant gases react with each other in the shower head and adhered materials are deposited on an inner wall of the shower head. To prevent the deposition of the adhered materials, an exhaust port is preferably installed in a buffer chamber to efficiently remove the remnant gases from the buffer chamber, and an atmosphere of the buffer chamber is preferably exhausted through the exhaust port. In this case, a component for preventing two gases and the purge gas (which are to be supplied to a process chamber) from diffusing toward the exhaust port for exhausting the buffer space, for example, a gas guide for forming the flow of gases, is installed in the buffer chamber. For example, the gas guide is installed between the exhaust port for exhausting the buffer space and a supply hole for supplying the two gases and the purge gas. The gas guide is preferably installed in a radial shape toward a dispersion plate of the shower head. To efficiently exhaust gases from an inner space of the gas guide, an inner side of the gas guide is in communication with a space between the exhaust port for exhausting the buffer space and the gas guide. Specifically, an outer circumferential end of the gas guide is in communication with a space between the exhaust port for exhausting the buffer space and the gas guide.

SUMMARY OF THE INVENTION

As a result of research conducted on a conventional structure by the inventors, the following problem has been found. That is, when a process gas is supplied, the process gas diffuses from a space installed between an outer circumferential end of a gas guide and an exhaust port toward the exhaust port. Since a gas diffusing from the space over the gas guide remains in a peripheral gas remaining unit, it is difficult to remove the gas even in a process of exhausting the above-described buffer space. Adhered materials become particles that adversely affect characteristics of a substrate or reduce yield.

It is a main object of the present invention to provide a substrate processing apparatus and a method of manufacturing a semiconductor device, which may inhibit generation of adhered materials even in a space above a gas guide and provide good substrate characteristics.

According to one aspect of the present invention, there is provided a substrate processing apparatus including: a process chamber configured to process a substrate; a buffer chamber installed above the process chamber, the buffer chamber including a dispersion unit configured to uniformly supply gases into the process chamber; a process gas supply hole installed in a ceiling portion of the buffer chamber, where a process gas supply unit is connected to an upstream side thereof in a gas supply direction; an inert gas supply hole installed in the ceiling portion, where an inert gas supply unit is connected to an upstream side thereof in the gas supply direction; a gas guide disposed above the dispersion plate and including a base end portion having a circumferential shape connected to a surface of the ceiling portion at a downstream side in a manner that the process gas supply hole is disposed at an inner circumferential side from the base end portion and the inert gas supply hole is disposed at an outer circumferential side from the base end portion; a process chamber exhaust unit configured to exhaust an atmosphere of the process chamber; and a control unit configured to control at least the process gas supply unit, the inert gas supply unit, and the process chamber exhaust unit.

According to another aspect of the present invention, there is provided a method of manufacturing a semiconductor device, including: a first process gas supply process of supplying a source gas into a process chamber through a process gas supply hole installed in a ceiling portion of a buffer chamber via an inner region of a gas guide and a dispersion plate which is installed between the gas guide and the process chamber and forms a bottom portion of the buffer chamber, and supplying an inert gas through an inert gas supply hole installed in the ceiling portion of the buffer chamber via an outer region of the gas guide; a second process gas supply process of supplying a reactive gas into the process chamber through the process gas supply hole via the inner region of the gas guide and the dispersion plate; and a substrate processing process of repeating the first process gas supply process and the second process gas supply process.

DETAILED DESCRIPTION OF THE PREFERRED EMBODIMENTS

Figure 1:
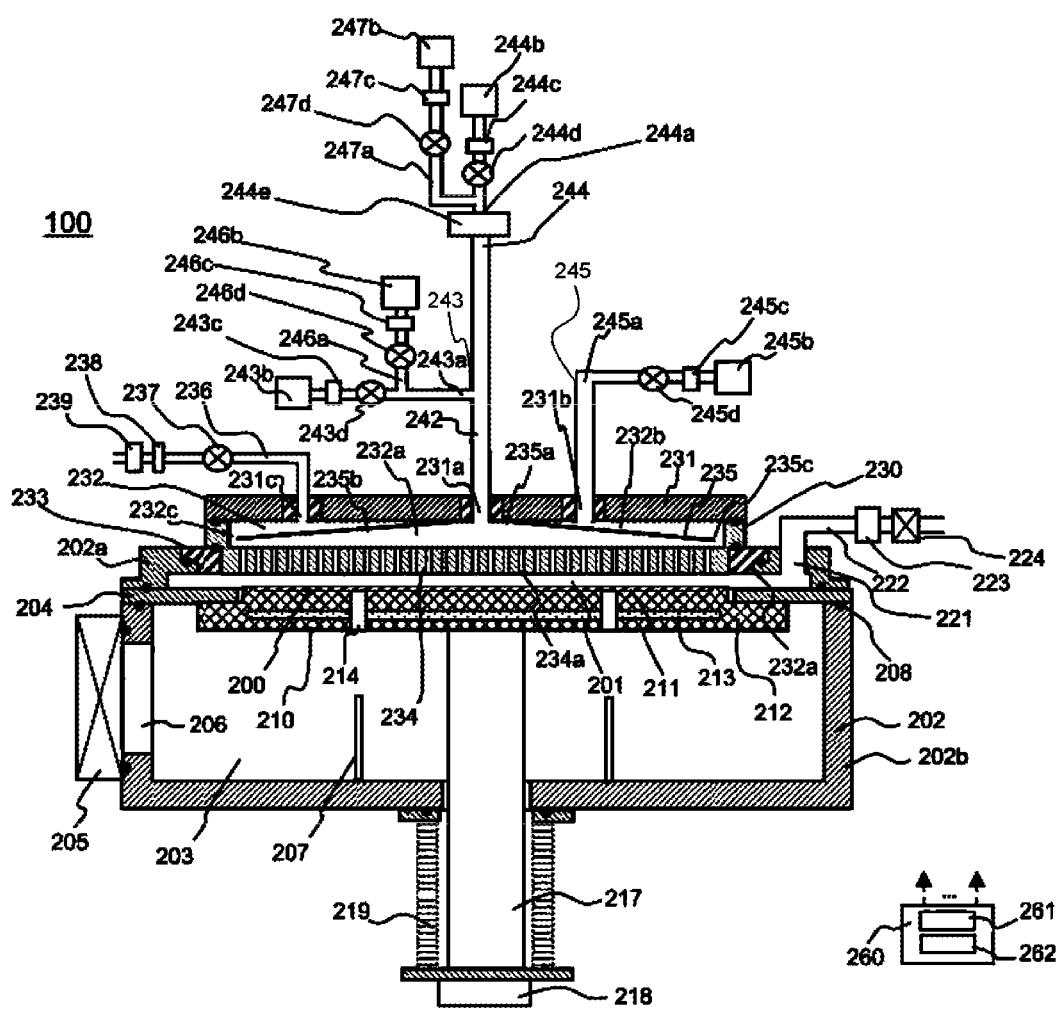
FIG. 1 is a cross-sectional view of a substrate processing apparatus according to a first embodiment of the present invention.

First Embodiment of the Present Invention (1) Configuration of Substrate Processing Apparatus Hereinafter, a substrate processing apparatus according to a first embodiment of the present invention will be described with reference to FIG. 1. FIG. 1 is a cross-sectional view of a substrate processing apparatus according to the present embodiment.

One embodiment of the present invention will now be described with reference to the accompanying drawings below. Initially, a substrate processing apparatus according to one embodiment of the present invention will be described.

A substrate processing apparatus 100 according to the present embodiment will be described. The substrate processing apparatus 100 is an apparatus configured to process a thin film. As shown in FIG. 1, the substrate processing apparatus 100 is configured as a single-wafer-type substrate processing apparatus.

As shown in FIG. 1, the substrate processing apparatus 100 includes a process container 202. The process container 202 is configured as, for example, a planar airtight container having a circular cross-section. Also, a sidewall or bottom surface of the process container 202 is formed of, for example, a metal material, such as aluminum (Al) or stainless steel (SUS). A process chamber 201 configured to process a wafer 200 (e.g., a silicon wafer) which is a substrate, and a transfer space 203 are formed in the process container 202. The process container 202 is constituted by an upper container 202a, a lower container 202b, and a shower head 230. A partition plate 204 is installed between the upper container 202a and the lower container 202b. A space which is surrounded by the upper process container 202a and the shower head 230 above the partition plate 204 is referred to as a process chamber space, and a space which is surrounded by the lower container 202b below the partition plate 204 is referred to as a transfer space. A component which is configured of the upper process container 202a and the shower head 230 and surrounds a process space is referred to as the process chamber 201. Also, a configuration surrounding the transfer space is referred to as a transfer chamber 203 in the process chamber 201. An O-ring 208 for air-tightly closing the process container 202 is installed between the respective structures.

A substrate loading and unloading port 206 which is adjacent to a gate valve 205 is installed at a side surface of the lower container 202b, and the wafer 200 moves between the lower container 202b and a transfer chamber (not shown) via the substrate loading and unloading port 206. A plurality of lift pins 207 are installed on a bottom portion of the lower container 202b. Also, the lower container 202b is grounded.

A substrate support unit 210 (which is also referred to as a substrate placing unit) for supporting the wafer 200 is disposed in the process chamber 201. The substrate support unit 210 mainly includes a substrate placing surface 211 for placing the wafer 200, a substrate placing table 212 having a surface on which the substrate placing surface 211 is formed, and a substrate placing table heater 213 (which is referred to as a first heater) contained in the substrate placing table 212 and serving as a heating source for heating the wafer 200. Through holes 214 through which the lift pins 207 are formed are installed in the substrate placing table 212 in positions corresponding to the lift pins 207.

The substrate placing table 212 is supported by a shaft 217. The shaft 217 penetrates a bottom portion of the process container 202 and is connected to an elevating mechanism 218 outside the process container 202. By moving the shaft 217 and the substrate placing table 212 by operating the elevating mechanism 218, the wafer 200 placed on the substrate placing surface 211 may be moved upward/downward. Also, the circumference of a lower end portion of the shaft 217 is coated with a bellows 219 to maintain an air-tight state inside the process container 202.

During the transfer of the wafer 200, the substrate placing table 212 is moved downward to a substrate support table until the substrate placing surface 211 reaches a position (a wafer transfer position) of the substrate loading and unloading port 206. During the processing of the wafer 200, the substrate support unit 21 is moved upward until the wafer 200 is in a process position (a wafer process position) of the process chamber 201 as shown in FIG. 1.

Specifically, when the substrate placing table 212 is moved downward to the wafer transfer position, upper end portions of the lift pins 207 protrude from a top surface of the substrate placing surface 211 so that the lift pins 207 can support the wafer 200 from below. Also, when the substrate placing table 212 is moved upward to the wafer process position, the lift pins 207 are buried from the top surface of the substrate placing surface 211 so that the substrate placing surface 211 can support the wafer 200 from below. Also, since the lift pins 207 are in direct contact with the wafer 200, the lift pins 207 are preferably formed of a material such as quartz or alumina.

(Process Gas Supply Hole)

A shower head 230 which will be described below is installed above the process chamber 201 (at an upstream side of a gas flow direction) and includes a ceiling plate 231 [which is also referred to as a covering 231]. A process gas supply hole 231a for supplying a process gas into the process chamber 201 is installed in the ceiling plate 231. Configuration of a process gas supply system connected to the process gas supply hole 231a will be described below. The ceiling plate 231 is also used as a ceiling wall of the shower head 230 or a ceiling wall of a buffer chamber 232.

(Inert Gas Supply Hole)

In addition, an inert gas supply hole 231b for supplying an inert gas into the process chamber 201 is installed in the ceiling plate 231.

(Shower Head)

A shower head 230 serving as a gas dispersing mechanism is mainly constituted by the ceiling plate 231 and a gas dispersion plate 234. The gas dispersion plate 234 is configured as a ceiling portion of the process chamber 201 and also as a bottom portion of the shower head 230. That is, the shower head 230 is installed in an upstream direction of the process chamber 201. A process gas is supplied into a buffer space in the buffer chamber 232 of the shower head 230 via the process gas supply hole 231a. Also, an inert gas is supplied into the buffer space in the buffer chamber 232 of the shower head 230 via the inert gas supply hole 231b.

The buffer chamber 232 is formed at a lower end portion of the covering 231 and at an upper end of the gas dispersion plate 234 which will be described below. That is, the gas dispersion plate 234 is installed at a downstream side of the gas flow direction when seen from the buffer chamber 232 (here, in the direction of the process chamber 201 below the buffer chamber 232). Also, the ceiling plate 231 is installed upstream from the buffer chamber 232 with respect to the gas supply direction.

The shower head 230 includes the gas dispersion plate 234 configured to disperse a gas introduced through the process gas supply hole 231a between a space of the buffer chamber 232 and a process space of the process chamber 201. A plurality of through holes 234a are installed in the gas dispersion plate 234. The dispersion plate 234 is disposed opposite to the substrate placing surface 211. The gas dispersion plate 234 includes a protruding portion in which the through holes 234a are installed and a flange portion installed around the protruding portion, and the flange portion is supported by an insulating block 233.

A gas guide 235 for forming the flow of the supplied gas is installed in the buffer chamber 232. The gas guide 235 includes a base end portion 235a connected to the ceiling plate 231, a plate portion 235b, and a leading end portion 235c. The base end portion 235a has, for example, a cylindrical shape and is connected to the ceiling plate 231 in a manner that the process gas supply hole 231a is disposed at an inner circumferential side of a circle of the cylindrical shape, and the inert gas supply hole 231b is disposed at an outer circumferential side of the circle of the cylindrical shape. Also, although a case in which the base end portion 235a has the cylindrical shape has been described, the present invention is not limited thereto and the base end portion 235a may have a tetragonal shape, etc. That is, the base end portion 235a may have circumferential shape in which the process gas supply hole 231a may be isolated from the inert gas supply hole 231b by the plate portion 235b so that the inert gas and the process gas do not mix.

The plate portion 235b has a configuration continuous with the base end portion 235a and has a circular conic shape, the diameter of which increases toward the gas dispersion plate 234 (toward the process chamber 201). The leading end portion 235c is an end portion of the plate portion 235b at a side other than the base end portion 235a. That is, the leading end portion 235c is an end portion of the plate portion 235b at a side of the process chamber 201. The leading end portion 235c has a cylindrical structure similar to the base end portion 235a. The diameter of the leading end portion 235c is formed further outward from an outermost circumference of a group of the through holes 234a. Also, the inert gas supply hole 231b is disposed between the base end portion 235a and the leading end portion 235c in a horizontal direction.

In the present embodiment, a region at an inner side of the plate portion 235b [a side of the gas dispersion plate 234] is referred to as an inner region 232a of the buffer space in the buffer chamber 232, and a region at an outer side of the plate portion 235b [a side of the ceiling plate 231] is referred to as an outer region 232b of the buffer space in the buffer chamber 232.

Since the plate portion 235b is continuous with the base end portion 235a, a process gas supplied through the process gas supply hole 235a is separated from an inert gas supplied through the inert gas supply hole 235b. A process gas supplied to the inner region 232a through the process gas supply hole 235a and an inert gas supplied to the outer region 232b through the inert gas supply hole 235b do not affect each other at the inner and outer sides of the plate portion 235b.

A space 232c is present between the leading end portion 235c and a sidewall of the buffer chamber 232. In a first process gas supply process (S202) or second process gas supply process (S208) which will be described below, the process gas diffuses in the inner region 232a toward the gas dispersion plate 234, and the inert gas flows toward the gas dispersion plate 234 along a surface of the plate portion 235b disposed at a side of the outer region 232b.

(First Exhaust System)

An exhaust pipe 236 is connected to an upper portion of the buffer chamber 232 via a exhaust port 231c for a shower head. A valve 237 which switches an exhaust operation on/off, a pressure adjuster 238 such as an auto-pressure controller (APC) which controls the inside of the buffer chamber 232 to a predetermined pressure, and a vacuum pump 239 are sequentially connected in series to the exhaust pipe 236. Also, the exhaust pipe 236, the valve 237, and the pressure adjuster 238 are referred to together as a first exhaust system or a buffer chamber exhaust unit.

(Process Gas Supply System)

A first-element-containing gas is mainly supplied from a first process gas supply system 243 containing a first gas supply pipe 243a, and a second-element-containing gas is supplied from a second process gas supply system 244 containing a second gas supply pipe 244a. A process gas supply system is constituted by the first process gas supply system 243 and the second process gas supply system 244.

The process gas supply system may be referred to as a process gas supply unit.

(First Process Gas Supply System)

A first gas supply source 243b, a mass flow controller (MFC) 243c which is a flow rate controller (flow rate control unit), and a valve 243d which is an opening/closing valve are sequentially installed at the first gas supply pipe 243a from an upstream end.

A gas containing a first element (hereinafter, the first-element-containing gas) is supplied to the shower head 230 through the first gas supply pipe 243a via the MFC 243c, the valve 243d, and a common gas supply pipe 242.

The first-element-containing as is a source gas, that is, a process gas. Here, a first element is, for example, titanium (Ti). That is, the first-element-containing gas is, for example, a titanium-containing gas. For example, $TiCl_4$ gas may be used as the titanium-containing gas. Also, the first-element-containing gas may be any one of a solid, a liquid, and a gas at normal temperature and pressure. When the first-element-containing gas is a liquid at normal temperature and pressure, a vaporizer (not shown) may be installed between the first gas supply source 232b and the MFC 243c. Here, an example in which the first-element-containing gas is a gas will be described.

In addition, a silicon-containing gas may be used. For example, an organic silicon material, such as hexamethyldisilazane ($C_6H_{19}NSi_2$, abbreviated as HMDS), trisilylamine [$(SiH_3)_3N$, abbreviated as TSA], or bis(tertiary-butyl-amino) silane ($SiH_2[NH(C_4H_9)]_2$, abbreviated as BTBAS) gas, may be used as the silicon-containing gas. These gases may function as precursors.

A downstream end of a first inert gas supply pipe 246a is connected to the first gas supply pipe 243a downstream from the valve 243d. An inert gas supply source 246b, an MFC 246c which is a flow rate controller (flow rate control unit), and a valve 246d which is an opening/closing valve are sequentially installed at the first inert gas supply pipe 246a from the upstream end.

Here, the inert gas is, for example, nitrogen ($N_2$) gas. As the inert gas, not only $N_2$ gas but also a rare gas, such as helium (He) gas, neon (Ne) gas, argon (Ar) gas, etc., may be used.

The inert gas is supplied through the first inert gas supply pipe 246a via the MFC 246c, the valve 246d, and the first gas supply pipe 243a into the shower head 230. The inert gas acts as a carrier gas or a rare gas in a thin film forming process (S104) which will be described below.

A first process gas supply system 243 (which is also referred to as a titanium-containing gas supply system) is mainly constituted by the first gas supply pipe 243a, the MFC 243c, and the valve 243d.

In addition, a first inert gas supply system is mainly constituted by the first inert gas supply pipe 246a, the MFC 246c, and the valve 246d. Also, the first inert gas supply system may further include the inert gas supply source 246b and the first gas supply pipe 243a.

The first process gas supply system 243 may include the first gas supply source 243b and the first inert gas supply system.

The first process gas supply system 243 may be referred to as a first process gas supply unit or a source gas supply unit.

(Second Process Gas Supply System)

A second gas supply source 244b, an MFC 244c which is a flow rate controller (flow rate control unit), a valve 244d which is an opening/closing valve, and a remote plasma unit 244e may be sequentially installed at the second gas supply pipe 244a from the upstream end.

A gas containing a second element (hereinafter, a second-element-containing gas) is supplied through the second gas supply pipe 244a via the MFC 244c, the valve 244d, the remote plasma unit 244e, and the common gas supply pipe 242 into the shower head 230. The second-element-containing gas is processed by the remote plasma unit 244e to generate plasma, and the plasma is irradiated onto the wafer 200.

The second-element-containing gas is a process gas. Also, the second-element-containing gas may be a reactive gas reactive with the first-element-containing gas or a modification gas for modifying a film containing the first-element-containing gas.

Here, the second-element-containing gas contains a second element other than the first element. The second element is, for example, any one of oxygen (O), nitrogen (N), and carbon (C). In the present embodiment, the second-element-containing gas is, for example, a nitrogen-containing gas. Specifically, ammonia ($NH_3$) gas is used as the nitrogen-containing gas.

A second process gas supply system 244 (which is also referred to as a nitrogen-containing gas supply system) is mainly constituted by the second gas supply pipe 244a, the MFC 244c, and the valve 244d.

A downstream end of a second inert gas supply pipe 247a is connected to the second gas supply pipe 244a at a downstream side of the valve 244d. An inert gas supply source 247b, an MFC 247c which is a flow rate controller (flow rate control unit), and a valve 247d which is an opening/closing valve 247d are sequentially installed at the second inert gas supply pipe 247a from the upstream end.

An inert gas is supplied through the second inert gas supply pipe 247a via the MFC 247c, the valve 247d, the second gas supply pipe 244a, and the remote plasma unit 244e into the shower head 230. The inert gas acts as a carrier gas or a rare gas in a film forming process (S104) (which is also referred to as a thin film forming process) which will be described below.

A second inert gas supply system is mainly constituted by the second inert gas supply pipe 247a, the MFC 247c, and the valve 247d. Also, the second inert gas supply system may further include the inert gas supply source 247b, the second gas supply pipe 243a, and the remote plasma unit 244e.

In addition, the second process gas supply system 244 may include the second gas supply source 244b, the remote plasma unit 244e, and the second inert gas supply system.

The second process gas supply system may be also referred to as a second process gas supply unit or a reactive gas supply unit.

(Inert Gas Supply System)

When the wafer 200 is processed, an inert gas is mainly supplied from the third gas supply system 245 including the third gas supply pipe 245a.

A third gas supply source 245b, an MFC 245c which is a flow rate controller (flow rate control unit), and a valve 245d which is an opening/closing valve 245d are sequentially installed at the third gas supply pipe 245a from the upstream end.

The inert gas, which is a purge gas, is supplied through the third gas supply pipe 245a via the MFC 245c and the valve 245d into the shower head 230.

Here, the inert gas is, for example, nitrogen ($N_2$) gas. As the inert gas, not only $N_2$ gas but also a rare gas, such as He gas, Ne gas, Ar gas, etc., may be used.

An inert gas supply system 245 is mainly constituted by the third gas supply pipe 245a, the MFC 245c, and the valve 245d.

The third gas supply system 245 may further include the third gas supply source 245b and a cleaning gas supply system.

In a substrate processing process, an inert gas is supplied through the third gas supply pipe 245a via the MFC 245c and the valve 245d into the shower head 230.

The inert gas supplied from the inert gas supply source 245b acts as a purge gas for purging gases remaining in the process chamber 201 or the shower head 230 in the thin film forming process (S104) which will be described below. Also, in the present disclosure, the inert gas supply system 245 is also referred to as the third gas supply system.

(Second Exhaust System)

An exhaust port 221 for exhausting an atmosphere of the process chamber 201 is installed in an inner wall of the process chamber 201 [upper container 202a]. An exhaust pipe 222 is connected to the exhaust port 221, a pressure adjuster 223, such as an APC, which controls the inside of the process chamber to a predetermined pressure, and an exhaust pump 224 are sequentially connected in series to the exhaust pipe 222. A second exhaust system 220 (exhaust line) is mainly constituted by the exhaust port 221, the exhaust pipe 222, the pressure adjuster 223, and the exhaust pump 224. The second exhaust system is also referred to as a process chamber exhaust unit.

(Controller)

The substrate processing apparatus 100 includes a controller 260 configured to control an operation of each component of the substrate processing apparatus 100. The controller 260 includes at least an operation unit 261 and a memory unit 262. The controller 260 calls a program or control recipe of the substrate processing apparatus from the memory unit 262 in response to an instruction from the controller 260 or a user and controls the operation of each of the components according to the contents of the program or the control recipe.

(2) Substrate Processing Process

<Film Forming Process>

Figure 2:
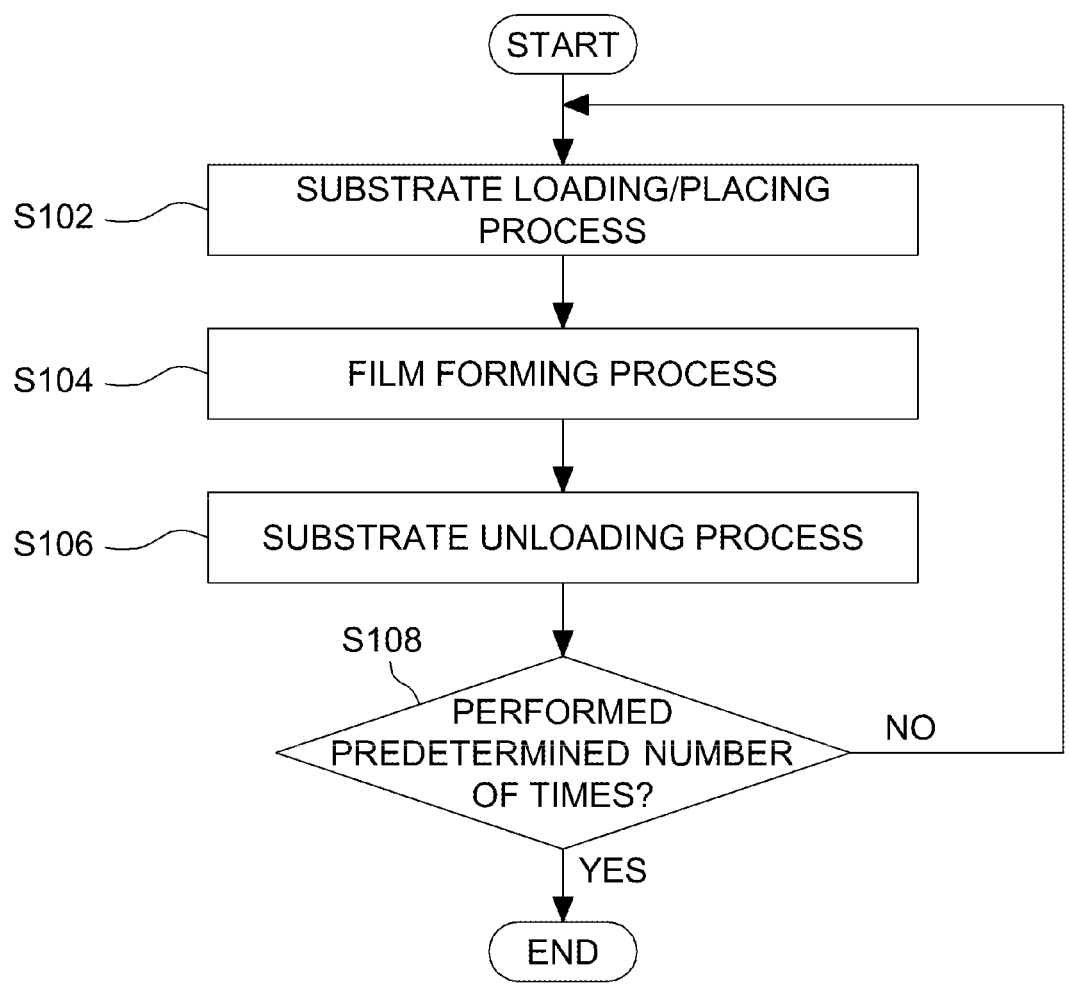
FIG. 2 is a flowchart illustrating a substrate processing process according to the first embodiment of the present invention.
Figure 3:
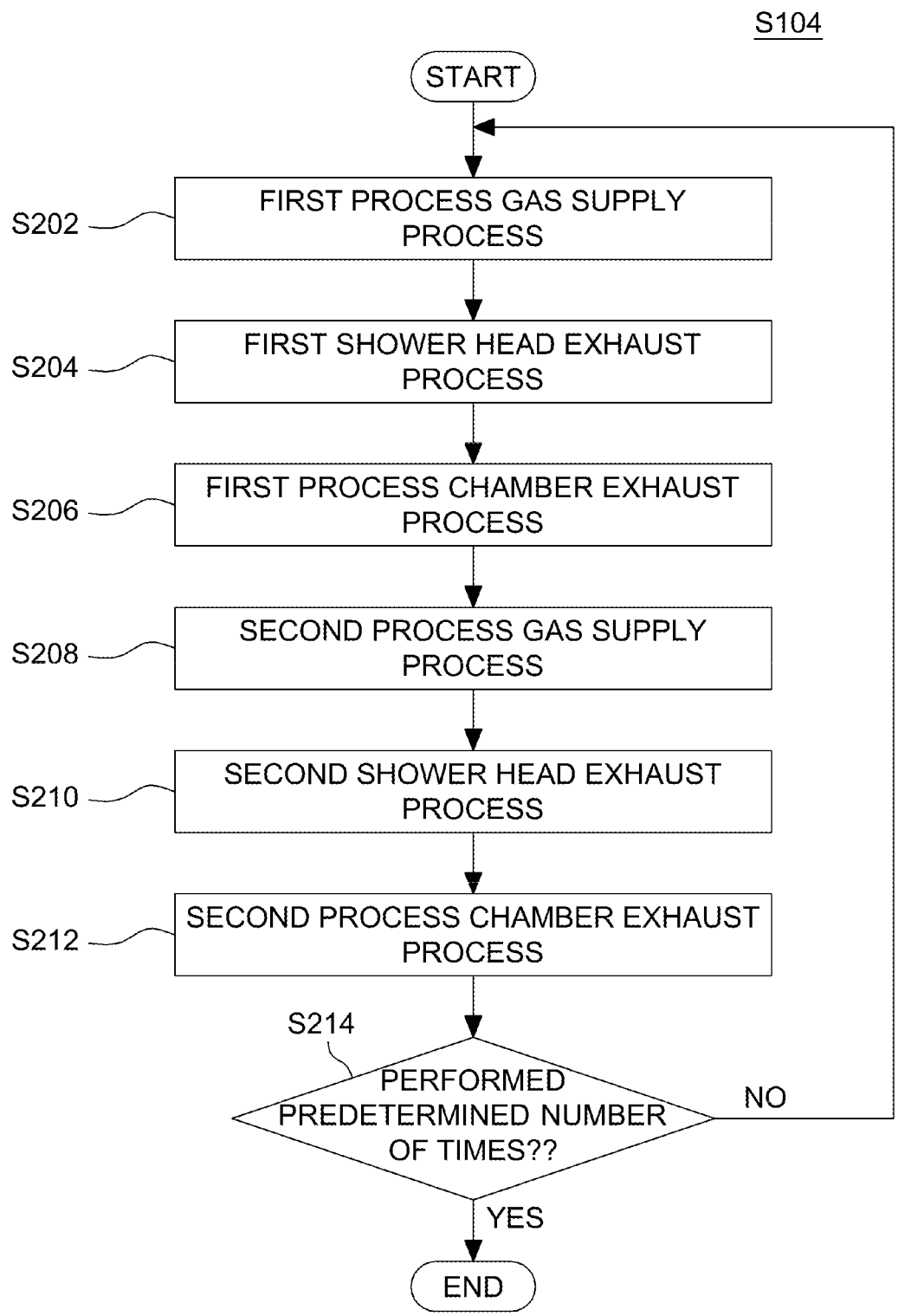
FIG. 3 is a timing chart illustrating gas supply timing in a film forming process according to the first embodiment of the present invention.
Figure 4:
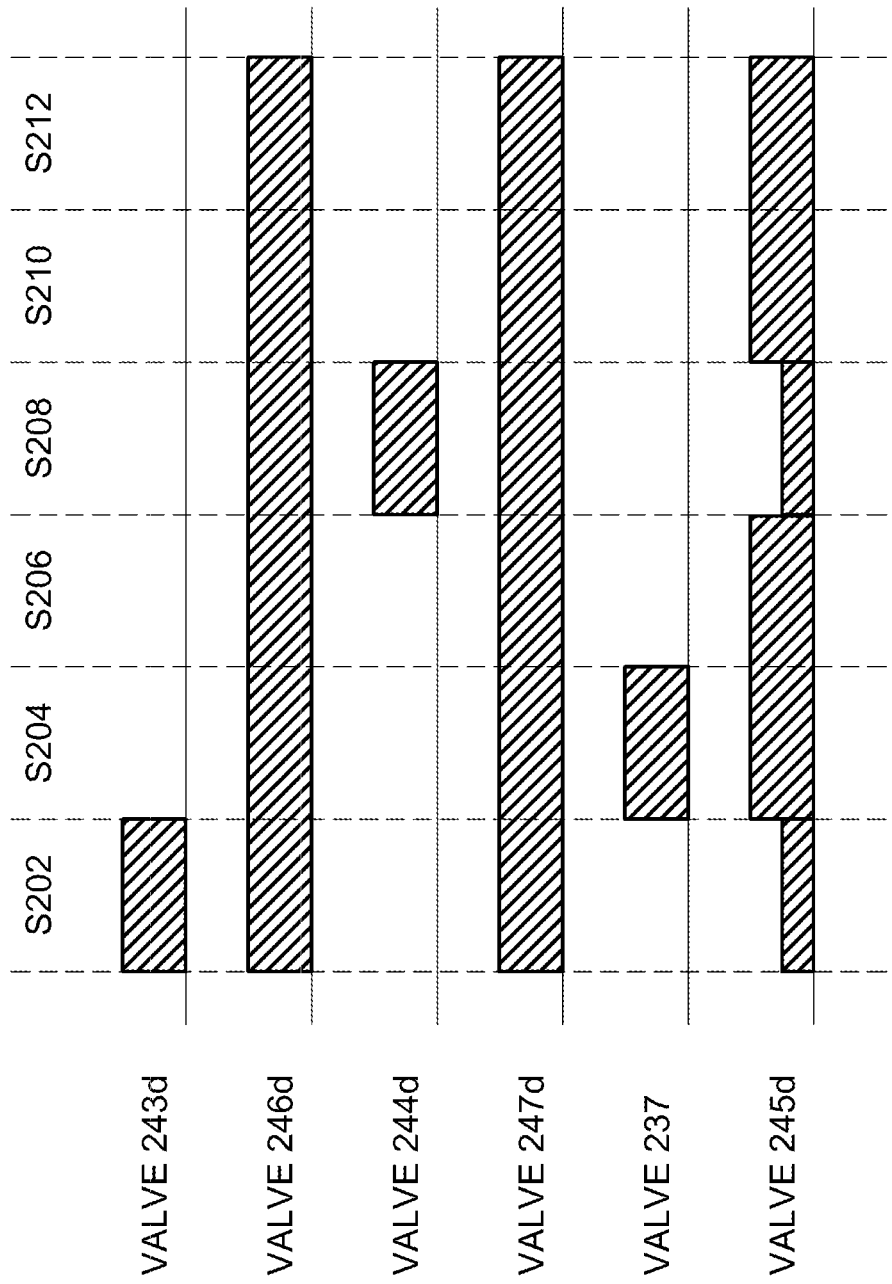
FIG. 4 is a flowchart illustrating the film forming process according to the first embodiment of the present invention.

Next, a process of forming a thin film on the wafer 200 using the substrate processing apparatus 100 will be described with reference to FIGS. 2, 3, and 4. FIGS. 2, 3, and 4 are flowcharts illustrating a film forming process according to an embodiment of the present invention. In the following description, an operation of each component constituting the substrate processing apparatus 100 is controlled by the controller 260.

The substrate processing process will now be schematically described with reference to FIGS. 2, 3, and 4. FIG. 2 is a flowchart illustrating a substrate processing process according to the present embodiment.

Here, an example in which a titanium nitride film is formed as a thin film on the wafer 200 using $TiCl_4$ gas as the first-element-containing gas and using ammonia ($NH_3$) gas as the second-element-containing gas will be described. For example, a predetermined film may be previously formed on the wafer 200. Also, a predetermined pattern may be previously formed on the wafer 200 or the predetermined film.

(Substrate Loading/Placing Process (S102))

In the substrate processing apparatus 100, the lift pins 207 penetrate the through holes 214 of the substrate placing table 212 by moving the substrate placing table 212 downward to the transfer position of the wafer 200. As a result, the lift pins 207 protrude only a predetermined height from the surface of the substrate placing table 212. Subsequently, the gate valve 205 is opened, the wafer 200 (processing substrate) is loaded into the process chamber 201 using a wafer carrier (not shown), and the wafer 200 is carried onto the lift pins 207. Thus, the wafer 200 is supported in a horizontal posture on the lift pins 207 protruding from the surface of the substrate placing table 212.

When the wafer 200 is loaded into the process container 202, the wafer carrier escapes from the process container 202, and the gate valve 205 is closed to air-tightly close the inside of the process container 202. Thereafter, the wafer 200 is placed on the substrate placing surface 211 installed on the substrate placing table 212 by moving the substrate placing table 212 upward.

When the wafer 200 is loaded into the process container 202, $N_2$ gas which is an inert gas is preferably supplied from the inert gas supply system into the process container 202 while exhausting the inside of the process container 202 using the exhaust system. That is, while the inside of the process container 202 is being exhausted by opening the APC valve 223 by operating the exhaust pump 224, $N_2$ gas is preferably supplied into the process container 202 by opening at least the valve 245d of the third gas supply system. Thus, intrusion of particles into the process container 202 or adhesion of particles onto the wafer 200 may be inhibited. Also, the exhaust pump 224 is always continuously operated at least after the substrate loading/placing process (S102) has been performed and until a substrate unloading process (S106) which will be described below ends.

When the wafer 200 is placed on the substrate placing table 212, power is supplied to the heater 213 buried in the substrate placing table 212 and/or the shower head 230 so that the surface of the wafer 200 can be set to a predetermined temperature. The temperature of the wafer 200 is set to be in the range of, for example, room temperature to a temperature of 500° C., and preferably a range of room temperature to a temperature of 400° C. In this case, the temperature of the heater 213 is adjusted by controlling an amount of current supplied to the heater 213 based on temperature information detected by a temperature sensor (not shown).

(Film Forming Process (S104))

Next, the thin film forming process (S104) is performed. A basic flow of the film forming process (S104) will be described, and features of the present embodiment will be described in detail below.

In the thin film forming process (S104), $TiCl_4$ gas is supplied via the buffer chamber 232 of the shower head 230 into the process chamber 201. After a predetermined time has elapsed since the supply of the $TiCl_4$ gas, the supply of the $TiCl_4$ gas is stopped, and the $TiCl_4$ gas is exhausted from the buffer chamber 232 and the process chamber 201 using a purge gas.

After the $TiCl_4$ gas is exhausted, plasma-state ammonia gas is supplied into the process chamber 201 via the buffer chamber 232. The ammonia gas reacts with a titanium-containing film formed on the wafer 200 and forms a titanium nitride film. After a predetermined time has elapsed, the supply of the ammonia gas is stopped, and the ammonia gas is exhausted from the shower head 230 and the process chamber 201 using a purge gas.

In the film forming process (S104), a titanium nitride film is formed to a desired thickness by repeating the flow.

(Substrate Unloading Process (S106))

Next, the wafer 200 is supported on the lift pins 207 protruding from the surface of the substrate placing table 212 by moving the substrate placing table 212 downward. Thereafter, the gate valve 205 is opened, and the wafer 200 is unloaded from the process container 202 using the wafer carrier. Thereafter, when the substrate processing process ends, the supply of an inert gas from the third gas supply system into the process container 202 is stopped.

(Process Number Determining Process (S108))

After the substrate is unloaded, it is determined whether or not the number of times the thin film forming process was performed has reached a predetermined number of times. When it is determined that the number of times the thin film forming process was performed has reached the predetermined number of times, the substrate processing process enters a cleaning process. When it is determined that the number of times the thin film forming process was performed has not reached the predetermined number of times, the substrate processing process enters the substrate loading/placing process (S102) to start processing the next wafer 200 which is on standby.

Next, the film forming process (S104) will be described in detail with reference to FIGS. 3 and 4.

(First Process Gas Supply Process (S202))

When each component has reached a desired temperature, the valve 243d is opened, and the supply of $TiCl_4$ which is a first process gas via the process gas supply hole 231a, the inner region 232a of the buffer chamber 232, and the plurality of through holes 234a into the process chamber 201 starts. In this case, the valve 246d is opened, and the supply of an inert gas which is a carrier gas also starts.

In the second process gas supply system, the valve 244d is switched off, and the valve 247d is switched on. Thus, the first process gas is prevented from being supplied into the second process gas supply system 244. By preventing the supply of the first process gas, adhesion of gases is prevented in the second process gas supply system 244.

In the third gas supply system, the valve 245d is opened, and an inert gas is supplied via the inert gas supply hole 231b to the outer region 232b of the buffer chamber 232. The supplied inert gas is supplied to the space 232c between the leading end portion 235c and the sidewall of the buffer chamber 232 along the plate portion 235b of the gas guide 235. The supplied inert gas is used as a gas curtain for inhibiting the first process gas from returning to the outer region 235b of the gas guide 235. Thus, adhesion of gases to the plate portion 235b adjacent to the outer region 232b or the sidewall of the buffer chamber 232 is prevented.

More preferably, the amount of the inert gas supplied from the third gas supply system is set to be such an amount as to inhibit gases from returning to the outer region 232b, and also to be smaller than the amount of gases supplied from the process gas supply system. In other words, the amount of the inert gas supplied from the third gas supply system is preferably set to be smaller than the sum of the amounts of the first gas and the inert gas supplied from the first process gas supply system and the amount of the inert gas supplied from the second process gas supply system.

Thus, dilution of the first gas in the vicinity of the leading end portion 235c may be inhibited. As a result, the first process gas which is a source gas may be uniformly supplied to a central portion and an outer portion of the substrate so that an in-plane surface of the substrate can be uniformly processed.

For example, when the first gas is supplied in such an amount as to be diluted, a difference in the supplied amount of the source gas is likely to occur between the central and outer portions of the substrate. In this case, a difference in exposure level occurs between the central and outer portions of the substrate. As a result, since a difference in film quality occurs in the in-plane surface of the substrate, device yield decreases.

$TiCl_4$ gas is uniformly dispersed by the gas guide 235 in the inner region 232a of the buffer chamber 232. The uniformly dispersed gas is uniformly supplied via the plurality of through holes 234a onto the wafer 200 disposed in the process chamber 201.

In this case, MFCs of the first process gas supply system and the second process gas supply system are adjusted such that $TiCl_4$ gas which is the first process gas, a carrier gas thereof, or a carrier gas of the second process gas supply system has a predetermined flow rate. Also, the MFC 245c is adjusted such that an inert gas which is the third process gas has a predetermined flow rate. Also, a supply flow rate of $TiCl_4$ gas is in the range of, for example, 100 sccm to 5,000 sccm. By appropriately adjusting an opening degree of the APC valve 223 by operating the exhaust pump 224, an inner pressure of the process container 202 is set to be a predetermined pressure.

The supplied $TiCl_4$ gas is supplied onto the wafer 200. By putting the $TiCl_4$ gas into contact with the wafer 200, a titanium-containing layer which is a first-element-containing layer is formed on the surface of the wafer 200.

The titanium-containing layer is formed to have a predetermined thickness and a predetermined distribution according to, for example, the inner pressure of the process container 202, a flow rate of $TiCl_4$ gas, a temperature of the substrate placing table 212, and a process time of a first process region 201a.

After a predetermined time has elapsed, the valve 243d is closed, and the supply of $TiCl_4$ gas is stopped. The valve 245d remains switched on, and the supply of an inert gas is continuously performed.

(First Shower Head Exhaust Process (S204))

After the valve 243d is closed and the supply of $TiCl_4$ gas is stopped, the valve 237 is switched on to exhaust the atmosphere of the shower head 230. Specifically, the atmosphere of the buffer chamber 232 is exhausted. In this case, the vacuum pump 239 is previously operated.

In this case, the valve 237 which is an opening/closing valve and the vacuum pump 239 are controlled in a manner that an exhaust conductance in the buffer chamber 232 from the first exhaust system is higher than a conductance of the exhaust pump 224 via the process chamber 201. Thus, the flow of gases from the center of the buffer chamber 232 toward the shower head exhaust port 231c is formed. As a result, gases adhered to the wall of the buffer chamber 232 or gases floating in the buffer space do not enter the process chamber 201 but are exhausted from the first exhaust system.

To rapidly exhaust the atmosphere of the buffer chamber 232, an inert gas is supplied from the third gas supply system.

More preferably, the MFC 245c is controlled in a manner that the amount of inert gas supplied from the third gas supply system is greater than in the first process gas supply process. By increasing the supply amount of the inert gas, the atmosphere of the buffer chamber 232 may be exhausted more rapidly. Also, a large amount of inert gas may be supplied to the inner region 232a so that a remnant gas of the inner region 232a can be removed more effectively.

In other words, in the first process gas supply process, the flow rate of the inert gas is controlled to prevent the inert gas supplied from the third gas supply system from reaching the inner region 232a and hindering the flow of the process gas. Also, in the first shower head exhaust process, even if the remaining first gas flows directly after the valve 243d is closed off, a flow rate of the first gas is controlled in a manner that an inert gas supplied from the third gas supply system reaches the inner region 232a and removes the remnant gas of the inner region 232a. Thus, the inert gas supplied from the third gas supply system is controlled to have a higher flow rate in the first shower head exhaust process than in the first process gas supply process.

(First Process Chamber Exhaust Process (S206))

After a predetermined time has elapsed, while the exhaust pump 224 of the second exhaust system is continuously operated, an opening degree of the APC valve 223 and an opening degree of the valve 237 are adjusted in a manner that an exhaust conductance from the second exhaust system is higher than an exhaust conductance from the first exhaust system via the shower head 230 in the process space. Thus, the flow of gases toward the second exhaust system via the process chamber 201 is formed. Accordingly, the inert gas supplied into the buffer chamber 232 may be supplied onto the substrate effectively, and the efficiency of removal of gases remaining on the substrate increases.

The supplied inert gas supplied in the process chamber exhaust process (S206) removes titanium that has not combined with the wafer 200 in the first process supply process (S202) from the wafer 200. Also, the valve 237 is opened, and the pressure adjuster 237 and the vacuum pump 239 are controlled to remove $TiCl_4$ gas remaining in the shower head 230. After a predetermined time has elapsed, the valve 245d is tightened to reduce a supplied amount of the inert gas, and the valve 237 is closed to cut off a space between the shower head 230 and the vacuum pump 239.

More preferably, after a predetermined time has elapsed, the valve 237 is closed off while continuously operating the exhaust pump 224 of the second exhaust system. In this case, since the flow of gases toward the second exhaust system via the process chamber 201 is not affected by the first exhaust system, the inert gas may be supplied onto the substrate more effectively, and efficiency of removal of gases remaining on the substrate further increases.

After the shower head exhaust process (S204), the process chamber exhaust process (S206) is continuously performed to obtain the following effects. That is, since residue is removed from the buffer chamber 232 in the shower head exhaust process (S204), even if gases flow over the wafer 200 in the process chamber exhaust process (S206), the remnant gas may be prevented from being adhered onto the substrate.

(Second Process Gas Supply Process (S208))

In the first process gas supply system, an inert gas is continuously supplied while maintaining the valve 243d in an off state and maintaining the valve 247d in an on state.

In the second process gas supply system, the valve 244d remains switched on while maintaining an operation state of the remote plasma unit 244e. Ammonia gas passes through the remote plasma unit 244e to generate plasma. Plasma containing radicals as a main substance is uniformly supplied onto the substrate via the buffer chamber 232 and the through holes 234a.

In this case, the MFC 244c is adjusted in a manner that ammonia gas has a predetermined flow rate. Also, a supply flow rate of the ammonia gas is in the range of, for example, 100 sccm to 5,000 sccm. $N_2$ gas which is a carrier gas may be supplied from the second inert gas supply system along with the ammonia gas. Also, the inner pressure of the process container 202 is set to a predetermined pressure by appropriately adjusting an opening degree of the APC valve 223.

Ammonia gas containing radicals as a main substance is supplied onto the wafer 200. The previously formed titanium-containing layer is modified by ammonia radicals to form, for example, a layer containing the element Ti and the element N on the wafer 200.

A modified layer is formed to have a predetermined thickness, a predetermined distribution, and a predetermined depth to which the element N intrudes into the titanium-containing layer, according to, for example, an inner pressure of the process container 202, a flow rate of the ammonia gas, a temperature of the substrate placing table 212, and a power supply state of a plasma generating unit (not shown).

After a predetermined time has elapsed, the valve 244d is closed off, and the supply of ammonia gas is stopped.

More preferably, in the second process gas supply process, the valve 245d connected to the third gas supply system remains switched on, and an inert gas is preferably supplied via the inert gas supply hole 231b into the buffer chamber 232. The supplied inert gas is used as a gas curtain for inhibiting the second process gas from returning to the outer region 235b. In the second process gas supply process, a reaction of the remnant first gas of the buffer chamber 232 with the ammonia gas may be inhibited. Accordingly, generation of adhered materials in the buffer chamber 232 may be inhibited with a higher probability. Also, the remnant first gas refers to a first gas which has passed over the gas curtain and returned to the outer region 232b in the first gas supply process or a first gas which has not been exhausted in the first shower head exhaust process.

More preferably, the amount of the inert gas supplied from the third gas supply system is set to be such an amount as to inhibit gases from returning to the outer region 232b, and also to be smaller than the amount of gases supplied from the process gas supply system. In other words, the amount of the inert gas supplied from the third gas supply system is preferably set to be smaller than the sum of the amounts of the second gas and the inert gas supplied from the second process gas supply system and the amount of the inert gas supplied from the first process gas supply system.

Thus, dilution of the second gas in the vicinity of the leading end portion 235c may be inhibited. As a result, the second process gas which is a reactive gas may be uniformly supplied to the central portion and the outer portion of the substrate so that the in-plane surface of the substrate can be uniformly processed.

For example, when the ammonia gas is supplied in such an amount as to be diluted, a difference in the supplied amount of the ammonia gas is likely to occur between the central and outer portions of the substrate. In this case, a difference in exposure level occurs between the central and outer portions of the substrate. As a result, a difference in film quality occurs and reduces yield.

(Second Shower Head Exhaust Process (S210))

After the valve 244d is closed off and the supply of ammonia gas is stopped, the valve 237 is switched on to exhaust the atmosphere of the shower head 230. Specifically, the atmosphere of the buffer chamber 232 is exhausted. In this case, the vacuum pump 239 is previously operated.

The valve 237 which is an opening/closing valve and the vacuum pump 239 are controlled in a manner that an exhaust conductance in the buffer chamber 232 from the first exhaust system is higher than a conductance of the exhaust pump 224 via the process chamber 201. Thus, the flow of gases from the center of the buffer chamber 232 toward the shower head exhaust port 231c is formed. As a result, gases adhered to the wall of the buffer chamber 232 or gases floating in the buffer space do not enter the process chamber 201 but are exhausted from the first exhaust system.

More preferably, the MFC 245c is controlled in a manner that the amount of inert gas supplied from the third gas supply system is greater than in the second process gas supply process. By increasing the supply amount of the inert gas, the atmosphere of the buffer chamber 232 may be exhausted more rapidly. Also, a large amount of inert gas may be supplied to the inner region 232a so that the remnant gas of the inner region 232a can be removed more effectively.

In other words, in the second gas supply process, the flow rate of the inert gas is controlled to prevent the inert gas supplied from the third gas supply system from reaching the inner region 232a and hindering the flow of the process gas. Also, in the second shower head exhaust process, even if the remnant process gas flows directly after the valve 244d is closed off, the flow rate of the process gas is controlled in a manner that the inert gas supplied from the third gas supply system reaches the inner region 232a and pushes the remnant gas of the inner region 232a out. Thus, the inert gas supplied from the third gas supply system is controlled to have a higher flow rate in the second shower head exhaust process than in the second process gas supply process.

(Second Process Chamber Exhaust Process (S212))

After a predetermined time has elapsed, while operating the exhaust pump 224 of the second exhaust system, the opening degree of the APC valve 223 and the opening degree of the valve 237 are adjusted in a manner that the exhaust conductance in the process space from the second exhaust system is higher than the exhaust conductance from the first exhaust system via the shower head 230. Thus, the flow of gases toward the second exhaust system via the process chamber 201 is formed. Accordingly, the inert gas supplied into the buffer chamber 232 may be supplied onto the substrate effectively, and the efficiency of removal of gases remaining on the substrate increases.

The inert gas supplied in the process chamber exhaust process (S212) removes titanium that has not combined with the wafer 200 in the first process gas supply process (S202) from the wafer 200. Also, the valve 237 is opened, and the pressure adjuster 237 and the vacuum pump 239 are controlled to remove ammonia gas remaining in the shower head 230. After a predetermined time has elapsed, the valve 243d is closed off to stop the supply of the inert gas, and the valve 237 is closed off to cut off a space between the shower head 230 and the vacuum pump 239.

More preferably, after a predetermined time has elapsed, the exhaust pump 224 of the second exhaust system is continuously operated to close off the valve 237. In this case, since the flow of the remnant gas of the buffer chamber 232 or the supplied inert gas toward the second exhaust system via the process chamber 201 is not affected by the first exhaust system, the inert gas may be supplied onto the substrate more effectively, and efficiency of removal of the remnant gas (that has not completely reacted with the first gas) from the substrate further increases.

After the shower head exhaust process (S204), the process chamber exhaust process (S206) is continuously performed to obtain the following effects. That is, since residue is removed from the buffer chamber 232 in the shower head exhaust process (S204), even if gases flow over the wafer 200 in the process chamber exhaust process (S206), the remnant gas may be prevented from being adhered onto the substrate.

(Determining Process (S214))

Thereafter, the controller 260 determines whether or not one cycle has been performed a predetermined number of times.

When the one cycle has not been performed the predetermined number of times (in the case of No in step S214), a cycle including the first process gas supply process (S202), the first shower head exhaust process (S204), the first process chamber exhaust process (S206), the second process gas supply process (S208), the second shower head exhaust process (S210), and the second process chamber exhaust process (S212) is repeated. When the one cycle has been performed the predetermined number of times (in the case of Yes in step S214), the thin film forming process (S104) ends.

Next, a second embodiment will be described with reference to FIGS. 5 and 6. In the second embodiment, since the same symbols as in the first embodiment refer to the same components as in the first embodiment, description thereof is omitted. Also, since a substrate processing method according to the present embodiment is the same as in the first embodiment, description thereof is omitted. Hereinafter, differences between the present embodiment and the previous embodiment will chiefly be described.

Figure 5:
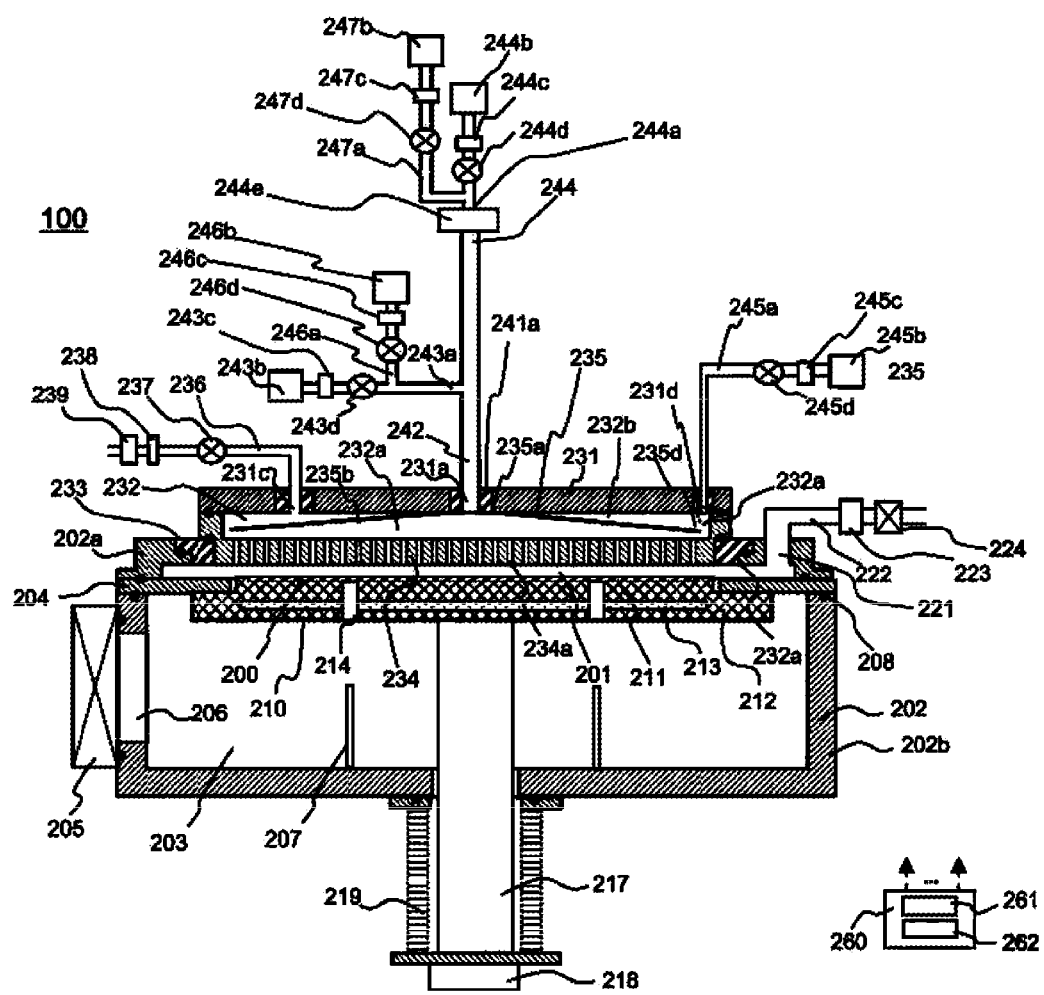
FIG. 5 is a cross-sectional view of a substrate processing apparatus according to a second embodiment of the present invention.

FIG. 5 is a configuration diagram of a substrate processing apparatus according to the second embodiment. The second embodiment differs from the first embodiment in that the inert gas supply hole 231d is installed outer than the leading end portion 235c in a horizontal direction, and inner than a contacting portion between a sidewall structure constituting the sidewall of the buffer chamber 232 and the ceiling plate 231.

Figure 6:
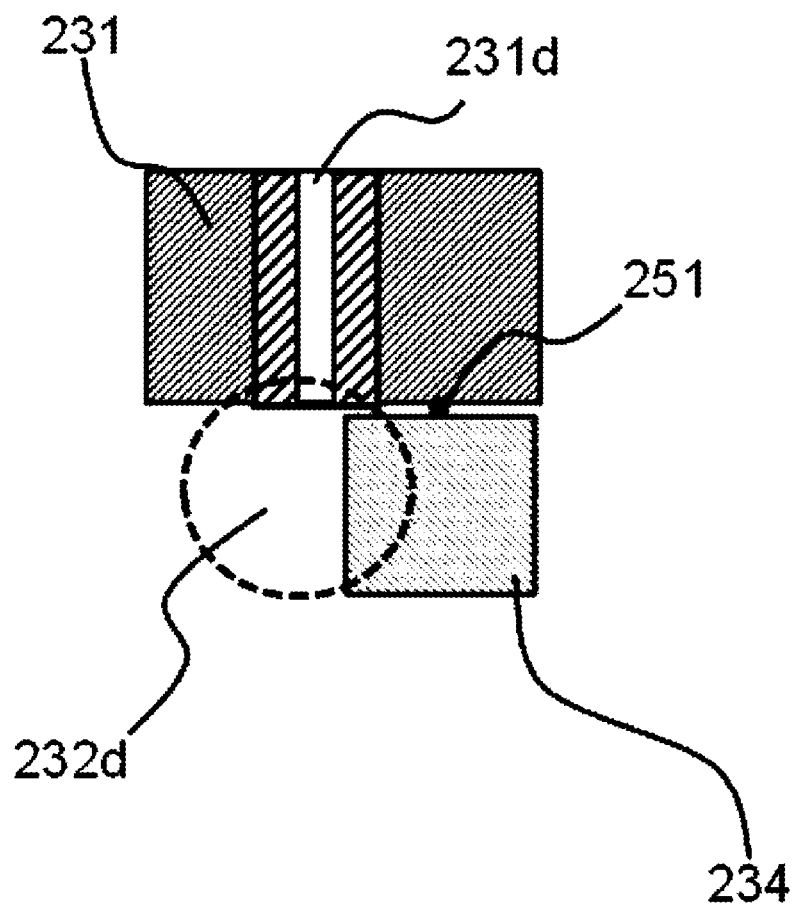
FIG. 6 is a diagram illustrating gas stagnation of the substrate processing apparatus according to the second embodiment of the present invention.

FIG. 6 is a diagram for explaining the above-described contacting portion between the sidewall structure and the ceiling plate 231. The sidewall structure of the dispersion plate 234 is in contact with the ceiling plate 231 via an O-ring 251. The O-ring 251 is used as a seal member. In the above-described configuration, a gap is installed between the sidewall structure of the dispersion plate 234 and the ceiling plate 231. Also, an angular portion 232d is formed. The gap or the angular portion 232d may serve as a gas holding unit. Even if a shower head exhaust process is performed, a process gas may remain. Thus, in the present embodiment, an inert gas supply hole is installed near the gas holding unit. As a result, as in the first embodiment, a process gas may be prevented from returning to the outer region 232b of the gas guide 235 in the process gas supply process. Also, gases which pass over the gas curtain and return to the outer region 232b may be prevented from intruding into the gas holding unit, and gases which could not be exhausted in the shower head exhaust process may be excluded from the gas holding unit.

In the previous embodiment, a case in which a titanium nitride film is formed on the wafer 200 using a titanium-containing gas as the first-element-containing gas and using a nitrogen-containing gas as the second-element-containing gas has been described, but the present invention is not limited thereto. A high-k film, such as a hafnium oxide (HfO) film, a zirconium oxide (ZrO) film, or a titanium oxide (TiO) film, may be formed on the wafer 200 using, for example, a silicon-containing gas, a hafnium (Hf)-containing gas, a zirconium (Zr)-containing gas, or a titanium (Ti)-containing gas as the first-element-containing gas.

In the previous embodiment, a case in which the shower head exhaust port 231b connected to the first exhaust system is installed in the covering 231 of the shower head 230 has been described, but the present invention is not limited thereto. For example, the shower head exhaust port 231b may be installed in a side surface of the buffer chamber 232.

The present invention provides a substrate processing apparatus and a method of manufacturing a semiconductor device, which can inhibit generation of adhered materials even above a gas guide and provide good substrate characteristics.

Embodiments of the present invention will be supplementarily described below.

(Supplementary Note 1)

According to one aspect of the present invention, there is provided a substrate processing apparatus including: a process chamber configured to process a substrate; a buffer chamber including a dispersion plate configured to uniformly supply gases into the process chamber and installed above the process chamber; a process gas supply hole to which a process gas supply unit is connected at an upstream side in a gas supply direction, the process gas supply hole installed in a ceiling portion of the buffer chamber; an inert gas supply hole to which an inert gas supply unit is connected at the upstream side in the gas supply direction, the inert gas supply hole installed in the ceiling portion of the buffer chamber; a gas guide including a base end portion having a circumferential shape connected to a surface of the ceiling portion at a downstream side in a manner that the process gas supply hole is disposed at an inner circumferential side of the base end portion and the inert gas supply hole is disposed at an outer circumferential side of the base end portion, the gas guide disposed above the dispersion plate; a process chamber exhaust unit configured to exhaust the atmosphere of the process chamber; and a control unit configured to control at least the process gas supply unit, the inert gas supply unit, and the process chamber exhaust unit.

(Supplementary Note 2)

According to another aspect of the present invention, there is provided a substrate processing apparatus including: a process chamber configured to process a substrate; a buffer chamber installed above the process chamber, the buffer chamber including a dispersion plate configured to uniformly supply gases into the process chamber; a process gas supply hole installed in a ceiling portion of the buffer chamber, where a process gas supply unit is connected to an upstream side thereof in a gas supply direction; an inert gas supply hole installed in the ceiling portion of the buffer chamber, where an inert gas supply unit is connected to an upstream side thereof in the gas supply direction; a gas guide installed at an upstream side of the dispersion plate and including a base end portion having a circumferential shape connected to a surface of the ceiling portion at a downstream side in a manner that the process gas supply hole is disposed at an inner circumferential side of the base end portion and the inert gas supply hole is disposed at an outer circumferential side of the base end portion, a plate portion having a circular conic shape, a diameter of which increases toward the process chamber, and a leading end portion which is an end portion other than the base end portion of the plate portion; a process chamber exhaust unit installed below the process chamber and configured to exhaust an atmosphere of the process chamber; and a control unit configured to control at least the process gas supply unit, the inert gas supply unit, and the process chamber exhaust unit.

(Supplementary Note 3)

The substrate processing apparatus of Supplementary note 2, wherein the inert gas supply hole is installed between the leading end portion and the base end portion in a horizontal direction.

(Supplementary Note 4)

The substrate processing apparatus of Supplementary note 2 or 3, wherein the control unit is configured to control the process gas supply unit and the inert gas supply unit in manner that that a flow rate of gases supplied through the process gas supply hole is higher than that of the inert gas supplied through the inert gas supply hole.

(Supplementary Note 5)

The substrate processing apparatus of Supplementary note 4, further including a buffer chamber exhaust unit connected to the buffer chamber and configured to exhaust the atmosphere of the buffer chamber, wherein the control unit is configured to control the buffer chamber exhaust unit and the inert gas supply unit in a manner that the atmosphere of the buffer chamber is exhausted after stopping a supply of the gases through the process gas supply hole by supplying the inert gas through the inert gas supply hole at an amount greater than an amount of the inert gas supplied through the inert gas supply hole when the gases are supplied through the process gas supply hole.

(Supplementary Note 6)

The substrate processing apparatus of Supplementary note 2 or 3, wherein the gases supplied through the process gas supply hole include at least one of a source gas and a reactive gas reactive with the source gas, and the control unit is configured to control the process gas supply unit and the inert gas supply unit in a manner that a flow rate of the gases containing the source gas supplied through the process gas supply hole is higher than that of the inert gas supplied through the inert gas supply hole.

(Supplementary Note 7)

The substrate processing apparatus of Supplementary note 6, further including a buffer chamber exhaust unit connected to the buffer chamber and configured to exhaust the atmosphere of the buffer chamber, wherein the control unit is configured to control the buffer chamber exhaust unit and the inert gas supply unit in a manner that the atmosphere of the buffer chamber is exhausted after stopping a supply of the gases containing the source gas through the process gas supply hole by supplying the inert gas through the inert gas supply hole at an amount greater than that of the inert gas supplied through the inert gas supply hole when the gases containing the source gas are supplied through the process gas supply hole.

(Supplementary Note 8)

The substrate processing apparatus of Supplementary note 2 or 3, wherein the gases supplied through the process gas supply hole include at least one of a source gas and a reactive gas reactive with the source gas, and the control unit is configured to control the process gas supply unit and the inert gas supply unit in a manner that a flow rate of the gases containing the reactive gas supplied through the process gas supply hole is higher than that of the inert gas supplied through the inert gas supply hole.

(Supplementary Note 9)

The substrate processing apparatus of Supplementary note 8, further comprising a buffer chamber exhaust unit connected to the buffer chamber and configured to exhaust an atmosphere of the buffer chamber, wherein the control unit is configured to control the buffer chamber exhaust unit and the inert gas supply unit in a manner that the atmosphere of the buffer chamber is exhausted after stopping a supply of the gases containing the reactive gas through the process gas supply hole by supplying the inert gas through the inert gas supply hole at an amount greater than that of the inert gas supplied through the inert gas supply hole when the gases containing the reactive gas are supplied through the process gas supply hole.

(Supplementary Note 11)

The substrate processing apparatus of Supplementary note 2, wherein the inert gas supply hole is installed outer than the leading end portion in a horizontal direction and inner than a contacting portion between a sidewall structure constituting a sidewall of the buffer chamber and a ceiling structure constituting the ceiling portion of the buffer chamber.

(Supplementary Note 12)

According to another aspect of the present invention, there is provided a method of manufacturing a semiconductor device, including: a first process gas supply process of supplying a source gas to a process chamber through a process gas supply hole installed in a ceiling portion of a buffer chamber via an inner region of a gas guide and a dispersion plate installed between the gas guide and the process chamber and forming a bottom portion of the buffer chamber, and supplying an inert gas through an inert gas supply hole installed in the ceiling portion of the buffer chamber via an outer region of the gas guide; a second process gas supply process of supplying a reactive gas to the process chamber through the process gas supply hole via the inner region of the gas guide and the dispersion plate; and a substrate processing process of repeating the first process gas supply process and the second process gas supply process.

(Supplementary Note 13)

According to another aspect of the present invention, there is provided a substrate processing apparatus including: a process chamber configured to process a substrate; a buffer chamber installed at an upstream side from the process chamber in a flow direction of a gas supplied into the process chamber; a first region installed in the buffer chamber; a second region installed in the buffer chamber and configured to communicate with the first region; a gas supply unit connected to the first region; an inert gas supply unit connected to the second region; and a exhaust unit connected to the second region.

What is claimed is:

1. A substrate processing apparatus comprising:
a process chamber configured to process a substrate;
a buffer chamber installed above the process chamber, the buffer chamber including a dispersion unit configured to uniformly supply gases into the process chamber;
a process gas supply hole installed in a ceiling portion of the buffer chamber, where a process gas supply unit is connected to an upstream side thereof in a gas supply direction;
an inert gas supply hole installed in the ceiling portion of the buffer chamber, where an inert gas supply unit is connected to an upstream side thereof in the gas supply direction;
a gas guide disposed in a gap between the dispersion unit and the ceiling portion, the gas guide including a base end portion disposed at a side of the process gas supply hole, a leading end portion disposed closer to the inert gas supply hole than to the process gas supply hole, and a plate portion connecting the base end portion and the leading end portion;
a process chamber exhaust unit configured to exhaust an atmosphere of the process chamber; and
a control unit configured to control at least the process gas supply unit, the inert gas supply unit, and the process chamber exhaust unit.

2. The apparatus of claim 1, wherein the inert gas supply hole is installed between the leading end portion and the base end portion in a horizontal direction.

3. The apparatus of claim 2, wherein the control unit control is configured to control the process gas supply unit and the inert gas supply unit in a manner that a flow rate of gases supplied through the process gas supply hole is higher than that of an inert gas supplied through the inert gas supply hole.

4. The apparatus of claim 3, further comprising a buffer chamber exhaust unit connected to the buffer chamber and configured to exhaust an atmosphere of the buffer chamber,
wherein the control unit is configured to control the buffer chamber exhaust unit and the inert gas supply unit in a manner that the atmosphere of the buffer chamber is exhausted after stopping a supply of the gases through the process gas supply hole by supplying the inert gas through the inert gas supply hole at an amount greater than an amount of the inert gas supplied through the inert gas supply hole when the gases are supplied through the process gas supply hole.

5. The apparatus of claim 2, wherein the gases supplied through the process gas supply hole include at least one of a source gas and a reactive gas reactive with the source gas, and the control unit is configured to control the process gas supply unit and the inert gas supply unit in a manner that a flow rate of the gases containing the source gas supplied through the process gas supply hole is higher than that of the inert gas supplied through the inert gas supply hole.

6. The apparatus of claim 2, wherein the gases supplied through the process gas supply hole include at least one of a source gas and a reactive gas reactive with the source gas, and the control unit is configured to control the process gas supply unit and the inert gas supply unit in a manner that a flow rate of the gases containing the reactive gas supplied through the process gas supply hole is higher than that of the inert gas supplied through the inert gas supply hole.

7. The apparatus of claim 6, further comprising a buffer chamber exhaust unit connected to the buffer chamber and configured to exhaust an atmosphere of the buffer chamber,
wherein the control unit is configured to control the buffer chamber exhaust unit and the inert gas supply unit in a manner that the atmosphere of the buffer chamber is exhausted after stopping a supply of the gases containing the reactive gas through the process gas supply hole by supplying the inert gas through the inert gas supply hole at an amount greater than that of the inert gas supplied through the inert gas supply hole when the gases containing the reactive gas are supplied through the process gas supply hole.

8. The apparatus of claim 1, wherein the control unit is configured to control the process gas supply unit and the inert gas supply unit in a manner that a flow rate of gases supplied through the process gas supply hole is higher than that of an inert gas supplied through the inert gas supply hole.

9. The apparatus of claim 8, further comprising a buffer chamber exhaust unit connected to the buffer chamber and configured to exhaust an atmosphere of the buffer chamber,
wherein the control unit is configured to control the buffer chamber exhaust unit and the inert gas supply unit in a manner that the atmosphere of the buffer chamber is exhausted after stopping a supply of the gases through the process gas supply hole by supplying the inert gas through the inert gas supply hole at an amount greater than an amount of the inert gas supplied through the inert gas supply hole when the gases are supplied through the process gas supply hole.

10. The apparatus of claim 1, wherein the gases supplied through the process gas supply hole include at least one of a source gas and a reactive gas reactive with the source gas, and the control unit is configured to control the process gas supply unit and the inert gas supply unit in a manner that a flow rate of the gases containing the source gas supplied through the process gas supply hole is higher than that of the inert gas supplied through the inert gas supply hole.

11. The apparatus of claim 10, further comprising a buffer chamber exhaust unit connected to the buffer chamber and configured to exhaust an atmosphere of the buffer chamber,
wherein the control unit is configured to control the buffer chamber exhaust unit and the inert gas supply unit in a manner that the atmosphere of the buffer chamber is exhausted after stopping a supply of the gases containing the source gas through the process gas supply hole by supplying the inert gas through the inert gas supply hole at an amount greater than that of the inert gas supplied through the inert gas supply hole when the gases containing the source gas are supplied through the process gas supply hole.

12. The apparatus of claim 1, wherein the gases supplied through the process gas supply hole include at least one of a source gas and a reactive gas reactive with the source gas, and the control unit is configured to control the process gas supply unit and the inert gas supply unit in a manner that a flow rate of the gases containing the reactive gas supplied through the process gas supply hole is higher than that of the inert gas supplied through the inert gas supply hole.

13. The apparatus of claim 12, further comprising a buffer chamber exhaust unit connected to the buffer chamber and configured to exhaust an atmosphere of the buffer chamber,
wherein the control unit is configured to control the buffer chamber exhaust unit and the inert gas supply unit in a manner that the atmosphere of the buffer chamber is exhausted after stopping a supply of the gases containing the reactive gas through the process gas supply hole by supplying the inert gas through the inert gas supply hole at an amount greater than that of the inert gas supplied through the inert gas supply hole when the gases containing the reactive gas are supplied through the process gas supply hole.

14. The apparatus of claim 1, wherein the inert gas supply hole is installed outer than the leading end portion in a horizontal direction and inner than a contacting portion between a sidewall structure constituting a sidewall of the buffer chamber and a ceiling structure constituting the ceiling portion of the buffer chamber.

15. A method of manufacturing a semiconductor device, comprising:
   (a) loading a substrate into a process chamber; and
   (b) supplying a process gas into the process chamber via a buffer chamber to process the substrate,
   wherein, the process gas and an inert gas are supplied into the buffer chamber through a process gas supply hole and an inert gas supply hole formed in a ceiling portion of the buffer chamber in the step (b), and
   the process gas and the inert gas are supplied into the process chamber via a gas guide and a dispersing unit constituting a bottom portion of the buffer chamber, the gas guide including a base end portion disposed at a side of the process gas supply hole, a leading end portion disposed closer to the inert gas supply hole than to the process gas supply hole, and a plate portion connecting the base end portion and the leading end portion.

* * * * *